United States Patent
Plamper et al.

(10) Patent No.: US 6,807,202 B1
(45) Date of Patent: Oct. 19, 2004

(54) PROCESS FOR STABILIZING THE OPTICAL OUTPUT POWER OF LIGHT-EMITTING DIODES AND LASER DIODES

(75) Inventors: Joerg Plamper, Schrobenhausen (DE); Josef Engl, Rohrbach (DE)

(73) Assignee: Sensor Line-Gesellschaft fuer Optoelektronische Sensoren mbH, Schroebenhausen (DE)

( * ) Notice: Subject to any disclaimer, the term of this patent is extended or adjusted under 35 U.S.C. 154(b) by 0 days.

(21) Appl. No.: 09/528,780

(22) Filed: Mar. 17, 2000

(30) Foreign Application Priority Data

Mar. 19, 1999 (DE) .......................................... 199 12 463

(51) Int. Cl.[7] .............................. H01S 3/10; H01S 3/13; H01S 3/00; H01S 3/04
(52) U.S. Cl. .............................. 372/29.02; 372/29.014; 372/29.015; 372/29.021; 372/34; 372/9; 372/38.07
(58) Field of Search ................................. 372/29.02, 31, 372/34, 35, 29.015, 29.014, 38.03, 38.07, 29.021, 33, 29.01, 29.011, 38.01, 38.02, 9, 32, 36, 43; 250/354.1; 374/178

(56) References Cited

U.S. PATENT DOCUMENTS

| | | | | |
|---|---|---|---|---|
| 4,604,753 A | * | 8/1986 | Sawai ........................... | 372/36 |
| 4,710,631 A | * | 12/1987 | Aotsuka et al. ........... | 250/354.1 |
| 4,713,819 A | * | 12/1987 | Yoshikawa ...................... | 372/9 |
| 5,392,303 A | * | 2/1995 | Shiozawa et al. ............. | 372/32 |
| 5,401,099 A | * | 3/1995 | Nishizawa et al. .......... | 374/178 |
| 5,414,280 A | * | 5/1995 | Girmay ........................ | 257/80 |
| 6,044,095 A | * | 3/2000 | Asano et al. .................. | 372/31 |

* cited by examiner

Primary Examiner—Don Wong
Assistant Examiner—Armando Rodriguez
(74) Attorney, Agent, or Firm—Milde & Hoffberg, LLP

(57) ABSTRACT

The invention relates to a method that can be used to compensate the influence of the temperature on the optical output power (light power) of light emitting diodes and laser diodes without the need to measure the temperature or light power. The method is based on the fact that the current flowing through a light emitting or laser diode and the forward voltage drop on the diode are at a constant light power independent of the temperature in a functional correlation that is often linear and can be obtained. If it is known, it must only be achieved during operation that the current and the forward voltage exhibit this correlation in order to eliminate the temperature effect on the light power.

14 Claims, 9 Drawing Sheets

PROCESS FOR STABILIZING THE OPTICAL OUTPUT POWER OF LIGHT-EMITTING DIODES AND LASER DIODES

BACKGROUND OF THE INVENTION

Light emitting diodes and laser diodes have attained considerable significance as light sources in measurement technology and for display purposes due to their low energy requirements, their small dimensions, their robustness, their modulation ability and last but not least due to their favorable price. For certain applications, it is a disadvantage that the optical output power of these light sources is dependent on their temperature; it decreases with a rising temperature. In measurement technology, this covers all applications where a quantity is measured via the transmission capability of any optical transmission distance. Examples are methods for measuring the turbidity or color of solids, liquids or gases, and especially fiber-optical methods for measuring the various quantities, where a light conducting fiber changes its optical properties under the influence of the measured quantity. Even in applications, where light emitting diodes are used solely for display purposes, the fulfillment of customer specifications or especially of legal requirements may require special measures to compensate the influence of temperature changes. In traffic lights, light emitting diodes can enable significant energy savings, for example; however, the temperature pattern of some types suitable for this purpose and the operating temperature range is so great that the brightness stipulated by the law could not be met without proper temperature compensation.

Basically, two methods are used for light emitting or laser diodes to maintain a constant optical output power. First, they could be controlled. However, the results of this method are not as satisfactory as would be intuitively expected because the brightness measurement that is required for this control would have to take place under particularly unfavorable conditions. First, a certain portion of the emitted light would have to be diverted and would need to be kept constant, which is already a first source of error. Because this light would later not be available, one would naturally attempt to make do with as little of it as possible. This is accompanied by a decrease in the relative measurement accuracy. In addition, the controlled light may often be needed in an illuminated environment, where naturally external light may get to the measurement receiver. The influence of such external light is greater the smaller the portion of the light is that is diverted for control purposes. And in addition to all that, the measurement receiver itself often exhibits a temperature dependency and is often additionally heated up by the energy loss at the light source. The same applies to the geometry of the transmission distance between light source and measurement receiver.

One can expect better results, when the temperature of the light or laser diode is maintained at the same level. For this purpose, the component or the chip is mounted on a thermoelectric cooling element together with a temperature sensor, and the temperature measured by the temperature sensor is maintained at a consistently low level using a controller, which in turn increases the light yield. One trusts that the thermal influence of the cooling element on the light source and the temperature sensor is large in comparison to influences from the surrounding area such that a consistent temperature of the light source can be inferred from a consistent temperature of the sensor. Since this is the case in good approximation, this type of light stabilization is often preferred for measurement purposes. However, it requires equipment expenditure. Light source, cooling element and temperature sensor not only need to be paid for but also assembled, often together with an additional so-called monitor photo diode that needs to be adjusted. The cooling element requires a high current at a low voltage, which is not easily provided by usual power supplies; in addition, it generates significant waste heat that must be removed. This procedure is, therefore, relatively expensive.

A third method consists of foregoing the cooling element, using a temperature sensor to measure the temperature of the light source or the surrounding temperature, and to control the light based on such a measurement. However, since light emitting or laser diode chips are relatively small, it is difficult to achieve good thermal coupling with the temperature sensor, such that its temperature, and thus, its measurement is not entirely a measure for the temperature of the light source. This is, of course, even more true when measuring the surrounding temperature. This type of stabilization is, therefore, not very precise. However, it is not very complex, can be implemented cost-effectively and provides, therefore, a practicable solution for display purposes, for example.

The aspect of the ability for modulation must always be taken into account in connection to the temperature stabilization of light emitting diodes or laser diodes. These light sources can be switched on and off in extremely short times. Thus, they not only provide significant advantages in telecommunication, but also in measurement technology, for example, incandescent lamps. For certain measurements, the latter must be equipped with a mechanical shutter, a so-called chopper to periodically shade the light and in this manner provide a means to compensate for the influence of the surrounding light. With light emitting and laser diodes, this effect can be achieved much easier and with much higher frequencies simply by interrupting the current. A significant quality feature of a method for its stabilization is, therefore, how quickly the emitted light power assumes a stable value. All methods where, initially, after switching on the light, any measured value changes and where this value is used to correct the light power, have significant disadvantages. This is the case for both, the control of the light power and also for the measurement of the chip temperature with a sensor. Since the measurement of the surrounding temperature does not provide an accuracy sufficient for measurement purposes, a stabilized light power can be well modulated only when using a thermoelectric cooling element.

Not least for reasons of good modulation capability it has already been considered several times to use the light emitting diode or laser diode itself as a temperature sensor. After all, semi-conductor diodes are well suited for this purpose; their forward voltage changes with a constant current over the temperature in a usable linearity. A measurement obtained from the diode itself would provide precisely that temperature that influences the light power and that is to be taken into account for the stabilization. Unfortunately, taking into account a changing temperature, the stabilization must be carried out by changing the diode current which should not be changed for the temperature measurement. A temperature measurement can no longer be deduced from the forward voltage alone, instead it is also affected by the current flowing at any given moment. Determining a measurement as a function of not one but two variables, in other words, the transition from a characteristic curve to a "characteristic area" is a path that is not preferred in measurement technology.

However, it is not absolutely necessary to explicitly know the temperature of a light emitting or laser diode to be able to compensate its influence. One can already envision this with the thought that a specific current is required for each temperature resulting in a specific value for the forward voltage from the diode characteristic curve that applies at the particular temperature. Thus, each temperature results in a point in the current/voltage diagram where the light power corresponds to the required value. For a temperature range, this turns into a line. It cannot be concluded implicitly that a combination of current and forward voltage that lies on this line will inevitably lead to the required light power. This depends on whether the respective combination is distinct for the temperature or whether it can occur at another temperature as well. If one manages to determine a line of constant light power, where all points apply distinctly for the temperature and if electrical circuit can be realized that keeps the combination of current and forward voltage stable on this line, then the light power can be stabilized via the temperature without measuring one of these two quantities.

SUMMARY OF THE INVENTION

It is the principal objective of the method described here, to provide a circuit for a light emitting diode or a laser diode such that the changes in electrical behavior caused by the temperature lead to a temperature-independence of its optical output power.

Some data sheets contain characteristic fields to characterize the electrical and the optical behavior of light emitting diodes or laser diodes as a function of the temperature, where, for example, the one field shows the forward voltage and the other the optical output power each as a function of the current with the temperature as a parameter. Theoretically, all information required for the stabilization of the respective components can be obtained from such diagrams. However, for practical applications, such information is not sufficiently accurate. This is not only due to the typically coarse presentation but also due to the fact that some particular subtleties must be taken into account during a measurement. For example, it is not particularly advisable to carry out this measurement with direct current in a temperature chamber as would correspond to the typical procedure. First, the temperature measured in this manner does not correspond to the temperature of the diode chip, whose value is not important but that matters nonetheless. Thus, the measurement of forward voltage and light power would absolutely need to be performed simultaneously to ensure that the measurements occur at the same temperature. Second, in a temperature chamber not only the light source but also the optical measurement structure would be heated up, and to design the latter in a temperature-independent fashion again constitutes particular problems.

For a full understanding of the present invention, reference should now be made to the following detailed description of the preferred embodiments of the invention as illustrated in the accompanying drawings.

DESCRIPTION OF THE PREFERRED EMBODIMENT

The preferred embodiment of the present invention will now be described with reference to FIGS. 1–16 of the drawings.

Figure 1:
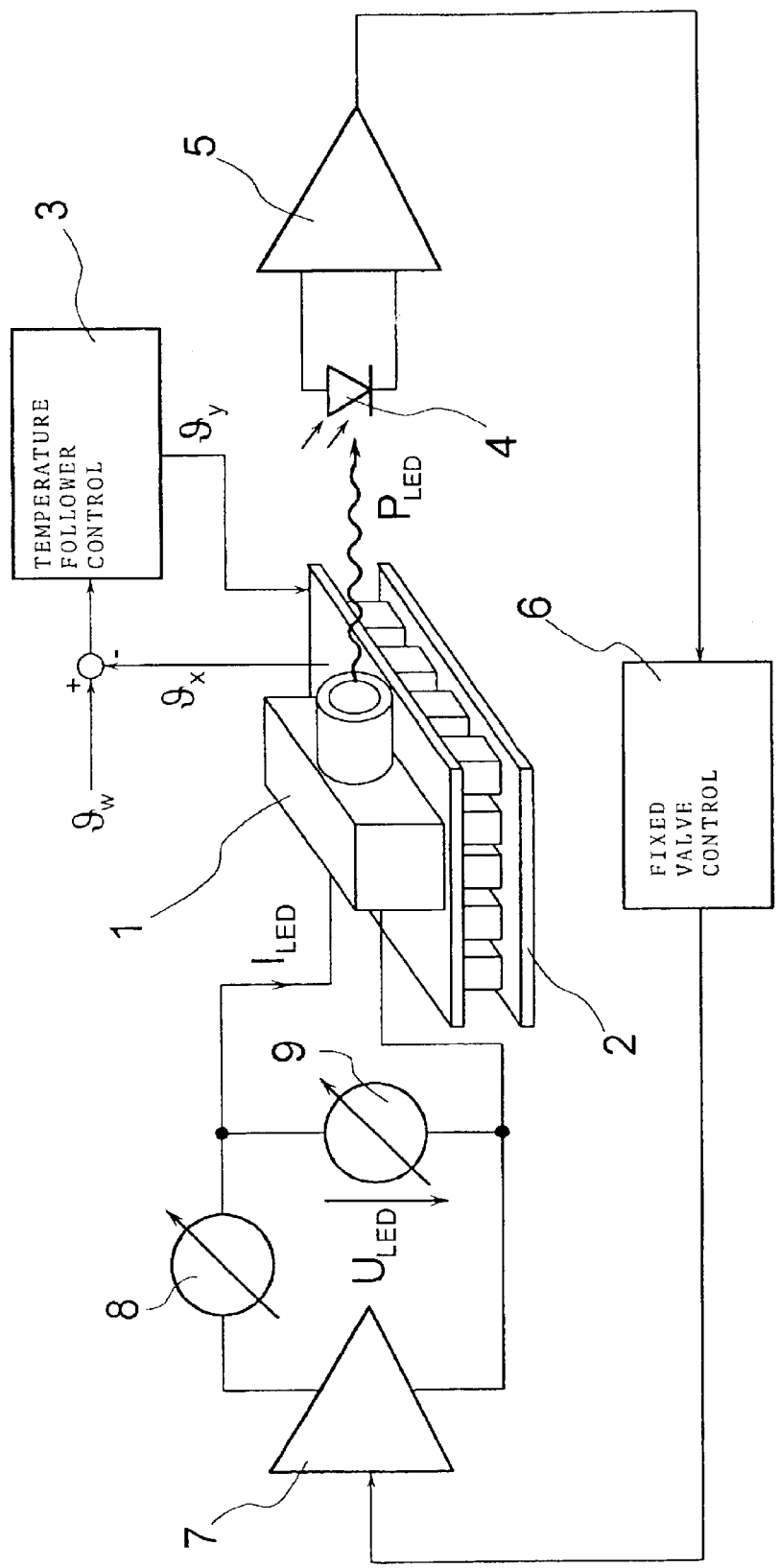
FIG. 1 is a block diagram of a circuit for determining the temperature behavior of a diode.

FIG. 1 shows a measurement structure that can be used to determine the temperature behavior of a light emitting diode or a laser diode for purposes of their stabilization without significant errors. Here, the diode (1) is presented in a special housing that is suitable for connecting a light conductor connector. A metallic casing is to be provided for components that are not already in such a housing such that these components can be mounted with good thermal contact on a thermoelectric cooling element (2). The temperature of this cooling element (peltier element), that is generally known can also be used for heating is varied at a constant speed using a temperature follower controller (3), which, of course, requires a temperature sensor (not shown here) mounted on the cooling element.

The optical output power of the light emitting diode or laser diode (1) $P_{LED}$ is measured with a photo detector (4) mounted in a thermally isolated manner. It is not advisable to use a light-conducting fiber for this purpose because the attachment at the transmitter would be warmed up as well and thus introduce its own temperature effect into the measurement result. Instead, it is better to shield the external light using a suitable tube or to perform the measurement in darkness.

Via a measurement amplifier (5), a set-value control (6) and a correcting element (7), the optical output power $P_{LED}$ is maintained at the same level by impressing a current $I_{LED}$. Of course, the nominal value for the set-value control (6) must be variable as well to enable measurements at various light powers; however, it will not be changed during a measurement procedure.

The current $I_{LED}$ as the regulated quantity and the forward voltage $U_{LED}$ resulting from it are now measured and recorded with suitable measurement devices (8) and (9) as simultaneously as possible. It is expedient to use for this purpose and for the nominal value specification of the temperature follower controller a desktop computer with a suitable analog/digital or digital/analog interface. This not only speeds up the measurement data capture but also ensures maximum reproducibility. The temperature is not measured, however it must be ensured that it varies in a sufficiently large range that should correspond to about the intended operating temperature range.

Figure 2:
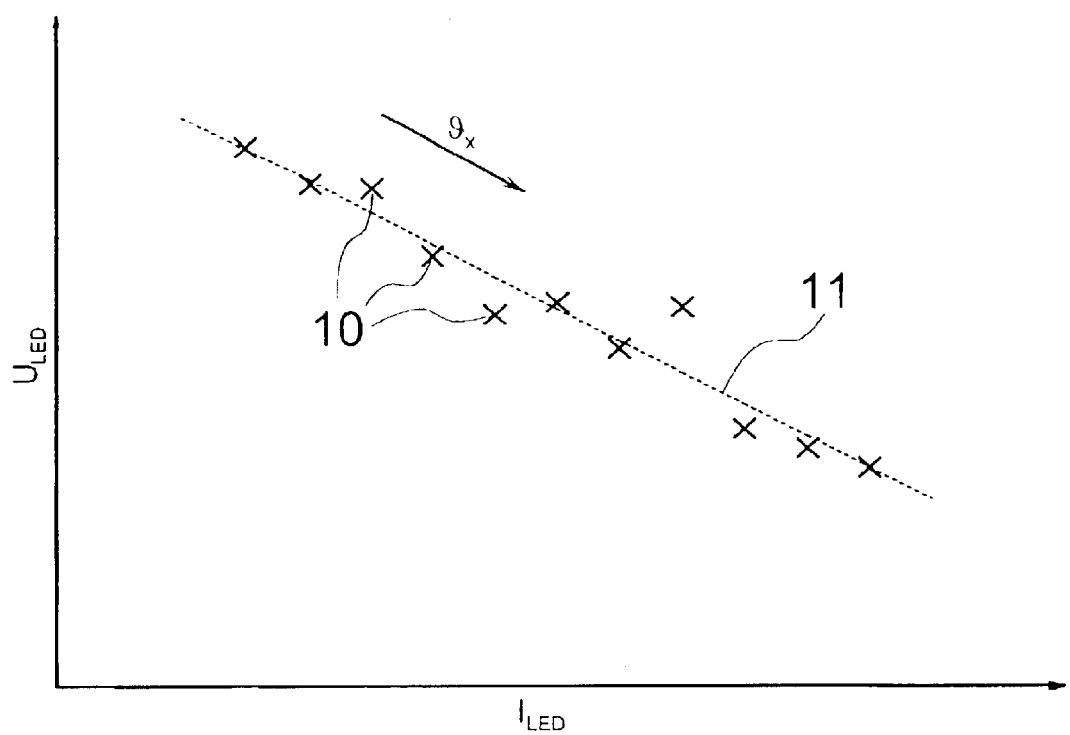
FIG. 2 is a current vs. forward voltage characteristic of a diode.

If one enters the obtained measurement data (10) for the current and forward voltage in a current/voltage diagram as shown in FIG. 2, a correlation will result that in many cases can be viewed as approximately linear. Using a compensation calculation, this linear correlation can be expressed as a function equation in the form of $$U_{LED} = m * I_{LED} + U_B \quad (1)$$

that describes a compensation line (11). It is noticeable that the constant m must have the unit V/A=Ω of an electric resistance and that is mostly negative, that is, the forward voltage decreases, even though the current for the compensation of the decrease in the light power caused by the increase in temperature must be increased.

If one assumes the constant m as resistance −R and rearranges equation 1 such that positive quantities are present on both sides, the result is $$U_B = R * I_{LED} + U_{LED} \quad (2)$$

Figure 3:
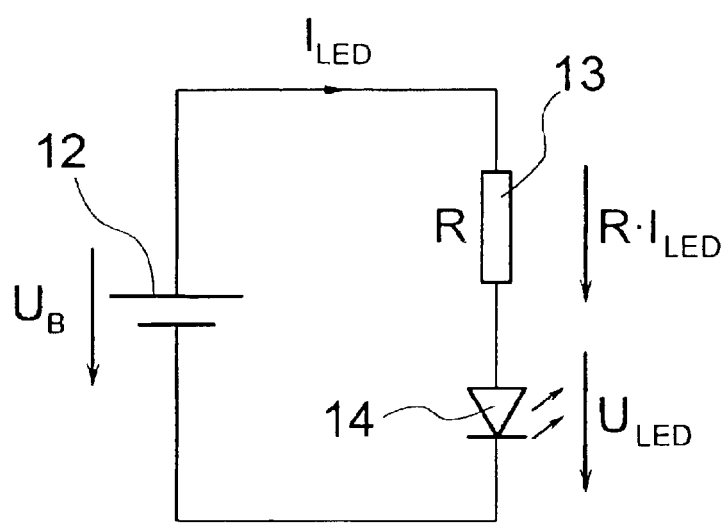
FIG. 3 is an equivalent circuit for a diode.

This is the interconnection equation of an electric circuit according to FIG. 3.

It is initially not easy to grasp why such a simple circuit should compensate the temperature influence on the optical output power of light emitting or laser diodes, especially since such light sources often operate with precisely such a not particularly innovative circuit and a stabilizing effect is rarely observed. This compensation is only achieved under the condition that the values for $U_B$ and R described above are maintained rather precisely. If the forward voltage of the diode (14) decreases due to temperature increase, a correspondingly greater voltage drop will occur at resistor R (13) causing a greater current, which in turn leads to a greater forward voltage at the diode. A new current will stabilize that is greater than the original current, and when $U_B$ and R have the proper value, this new current will compensate the decrease of the light power caused by the increase in temperature.

The reason why the operation of a light emitting or laser diode with a series resistor at a voltage source rarely leads to a temperature stabilization is simply because the required values for $U_B$ and R are not used in practical applications. The voltages are in a range of about 1–3 V and the resistances at about a few Ohm. The common significantly higher voltages and greater series resistances represent from the viewpoint of the diode almost a constant current source, and thus, no stabilization can be achieved.

Following, the designations $U_B$ and R are always used in the sense of Equation 2 or FIG. 3, respectively, that is, as parameters for the linear progression of a line of constant light power.

It has shown that the method does not function equally well in all instances. There are diode types that are easier to stabilize and such that are more difficult to stabilize. Also, the light power quantity that is to be stabilized is of significance. This, and how to differentiate between more and less suitable light emitting or laser diodes can be understood when using simulation calculations.

Of great significance is the parasitic series resistance that any diode exhibits and that leads to an initially exponential increase of the transmission characteristic that soon approaches a line, although a steep one. For light emitting or laser diodes, this series resistance may be significantly greater than for rectifier diodes, for example, where a particular value is given to a low ohmic resistance. In data sheets it is specified with values of about 3–4Ω, however information regarding tolerances and temperature patterns are often missing.

For the simulation calculations carried out here, the electrical behavior of the diode is represented by an ideal diode characteristic with a series resistor that may be temperature-independent. Assuming a correlation of $$P_{LED} = I_{LED} / (I + c(\Theta - \Theta_0)) \quad (3)$$

the behavior observed in the trial is obtained for the optical output power. In this equation, (Θ) stands for the temperature and ($\Theta_0$) for a reference temperature where the light power assumes a nominal value. The extent of the temperature-dependency can be set with the constant c.

Figure 4:
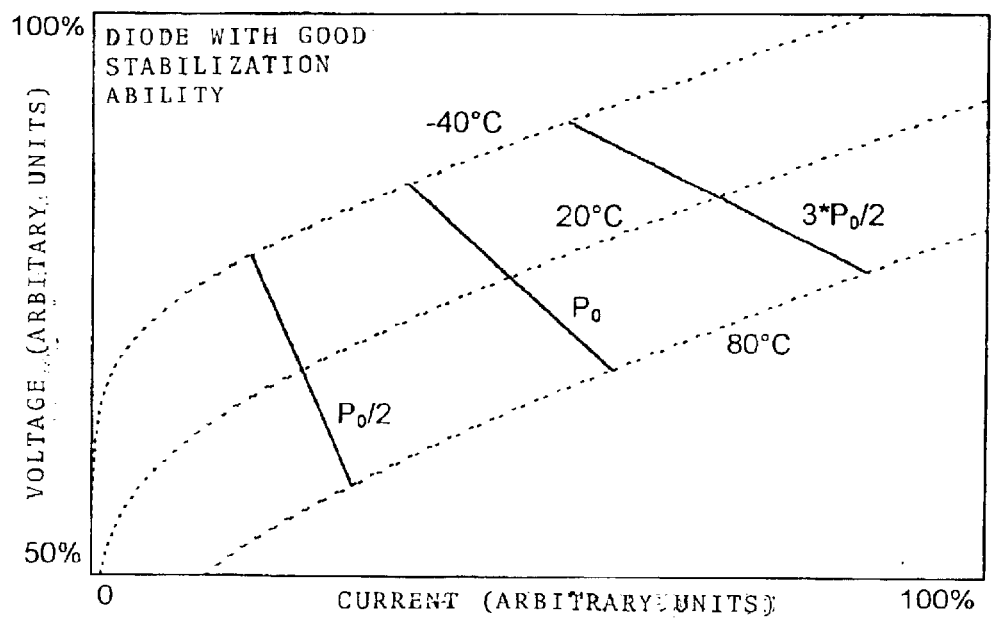
FIG. 4 is a current vs. voltage diagram for a stabilized diode showing lines of constant light output

Similar to FIG. 2, FIG. 4 shows lines of constant light power for a light emitting diode that can be stabilized well. The dashed lines are the diode characteristics at the borders and in the center of the simulated temperature range. One can see that the value of R that corresponds to the negative slope of the line must be made smaller the greater the selected light power is. On the other hand, the voltage $U_B$ changes very little. Diodes with such a behavior, which are indeed available, should be given preference.

Figure 5:
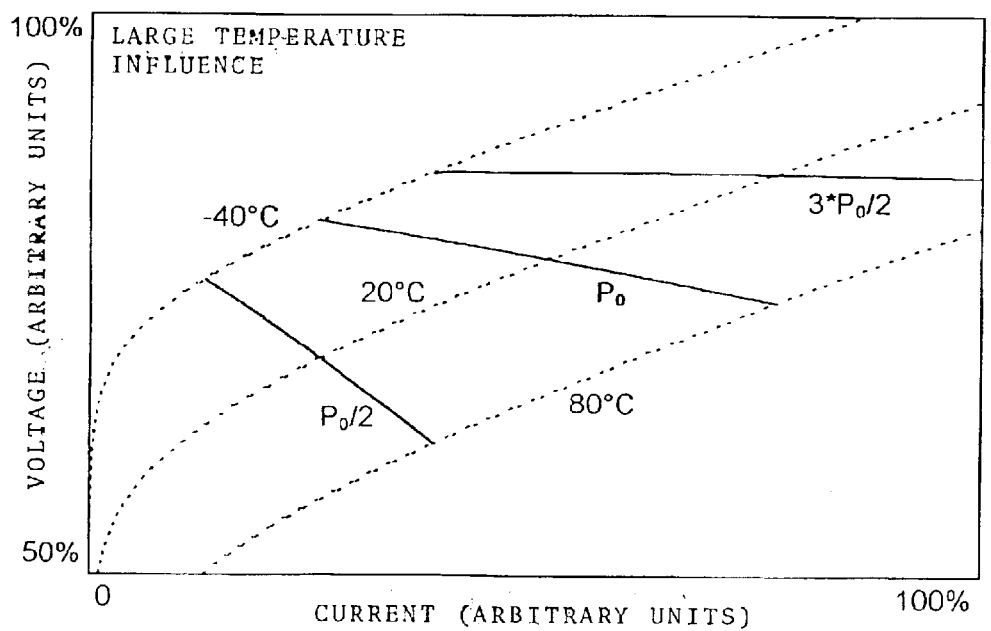
FIG. 5 is a current vs. voltage diagram for a diode subject to temperature effects, with lines of constant light output.

In comparison, FIG. 5 shows the results for a diode with a greater influence of the temperature on the light power but otherwise the same data. This indicates that both $U_B$ and R decrease with the increase in the temperature influence. The borderline case is a temperature-independent diode where the line would run vertically corresponding to the infinite resistance and infinitely high voltage, or the operation of a constant current source, respectively. Here, the line at 3 $P_o/2$ runs almost horizontally and indeed there are instances where the parasitic series resistance is so great that the operation of the diode with a constant voltage source leads to its stabilization.

Figure 6:
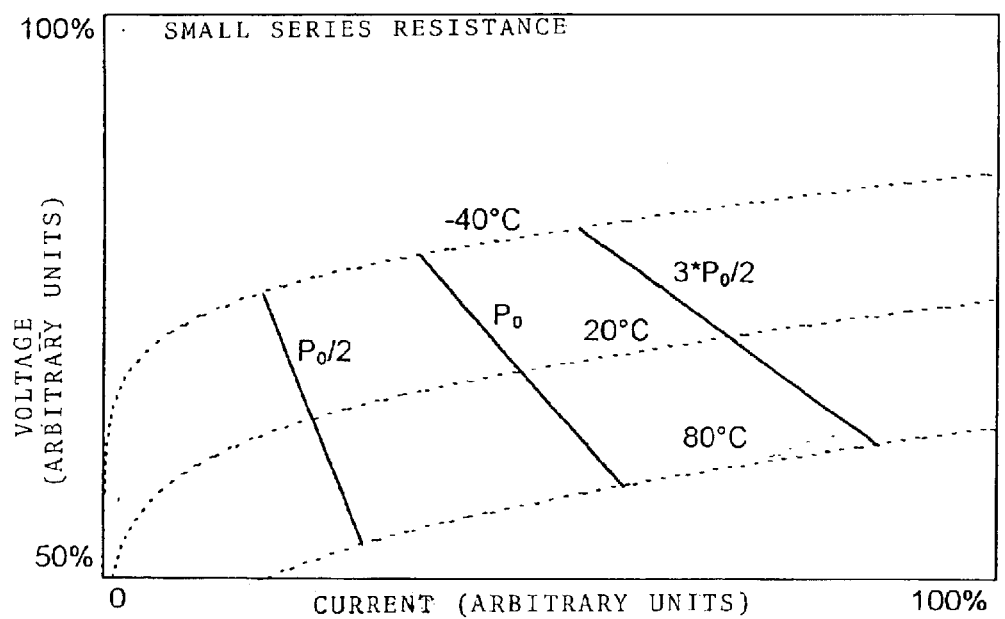
FIG. 6 is a current vs. voltage diagram for a diode showing the influence of a small parasitic series resistance.
Figure 7:
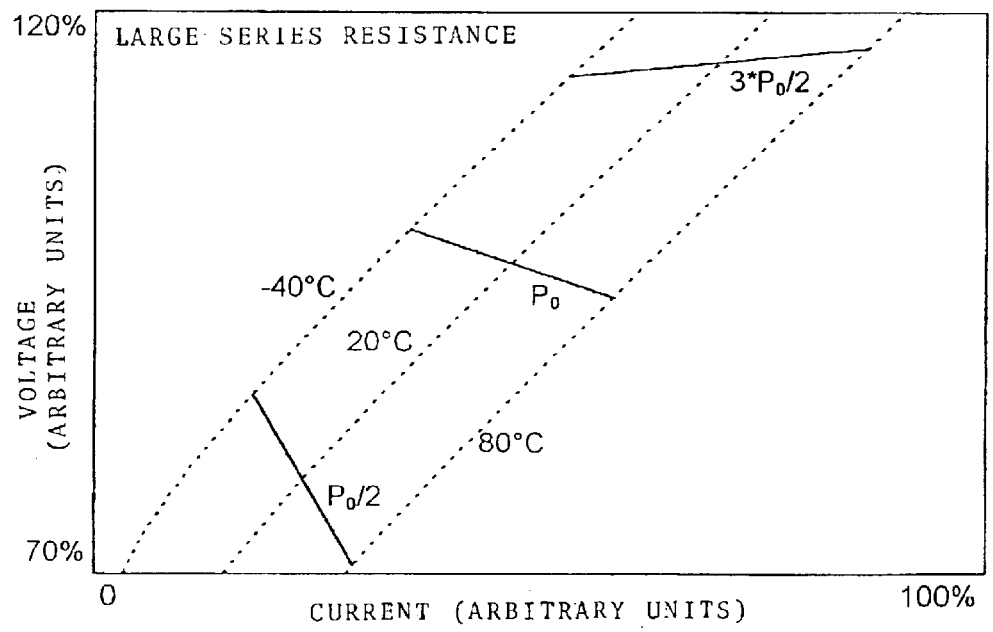
FIG. 7 is a current vs. voltage diagram for a diode showing the influence of a large parasitic series resistance.

FIG. 6 and FIG. 7 present the influence of the parasitic series resistance. The diode characteristics become more flat (here more steep) the greater this influence; in turn, the external resistance R for the stabilization must be selected correspondingly smaller. As shown in FIG. 7, it is indeed possible that the instance recognizable in FIG. 5 of a horizontal line is exceeded, which would require a negative external resistance.

Figure 8:
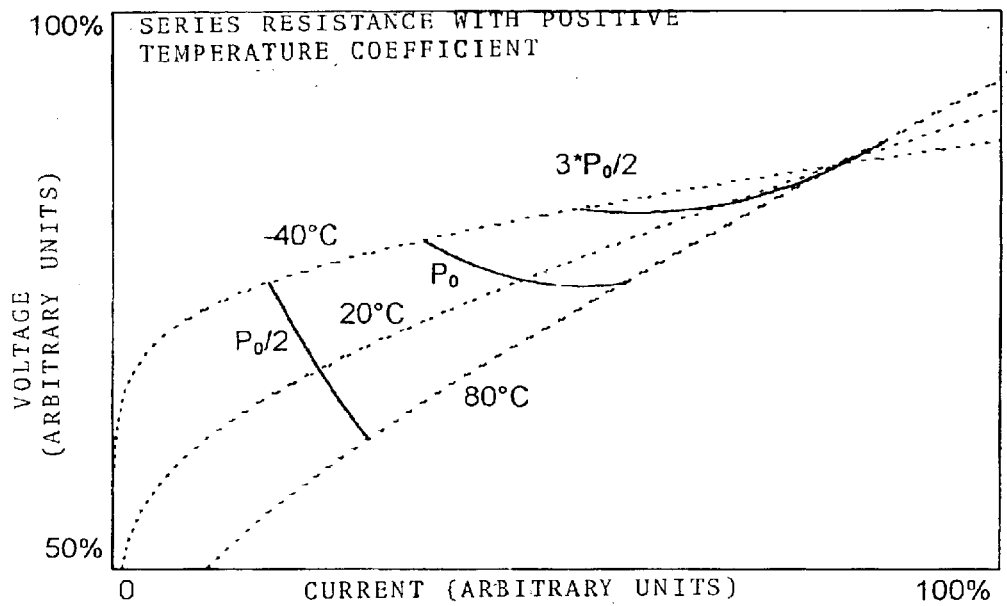
FIG. 8 is a current vs. voltage diagram for a diode having a series resistor with a positive temperature coefficient.

FIG. 8 indicates the limits of the method: Here, the assumption was made that the parasitic series resistance increases with the temperature. It is trivial that in this case the external resistance R can no longer be selected as a constant value, which is represented by the curvature of the previously straight line. More important is, however, that a positive temperature coefficient of the parasitic series resistance leads to intersecting diode characteristics, that is, that a certain combination of current and forward voltage can occur for several temperatures, and as a result, for various light powers. A direct result of intersecting characteristics is that a curve of constant light power must run almost parallel to the characteristics and may intersect it several times.

An electronic circuit, no matter what kind, can no longer "decide" from the combination of current and forward voltage, whether the current light power is too great or too small and what should be "done" to counteract it. Although this is not expressed by unstable behavior, but it always shows that the effect of the measures leave much to be desired and may even result in a worsening reaction to the temperature. This applies even more, the closer the selected line of constant light power approaches the intersecting point or area of the diode characteristic. If it stays at a sufficient distance, for example the line for $P_o/2$ in FIG. 8, a sufficiently suitable temperature stabilization can still be achieved. Light emitting diodes with a behavior similar to the one presented in FIG. 8 are known from practical applications.

Figure 9:
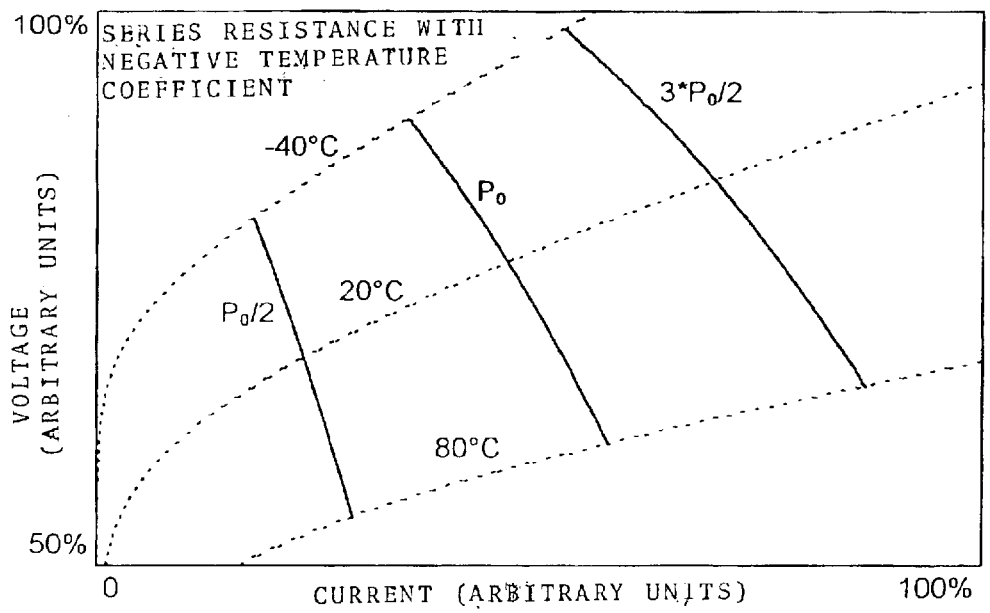
FIG. 9 is a current vs. voltage diagram for a diode having a series resistor with a negative temperature coefficient.

FIG. 9 shows the opposite case of a negative temperature coefficient of the parasitic series resistance. Such a behavior is not yet known from practical applications, however, one must take the possibility into consideration. It is noticeable that the divergence of the diode characteristics leads to generally greater slopes of the lines of constant light power. Regardless of the curvature that can be recognized here as well, such a behavior can prove to be advantageous in some applications. It is to be expected that the values for $U_B$ and R are more critical the more acute the angle of intersection between the diode characteristic and the line of constant light power. Since the components in the circuit of the diode are subject to temperature influences as well, they should, if possible, not be placed at the operation location of the diode but rather at a location where there are no big temperature fluctuations. If this is not possible, using a diode with a series resistance that exhibits a negative temperature coefficient may lead to better results even though the temperature pattern cannot be compensated for entirely, even theoretically.

Figure 10:
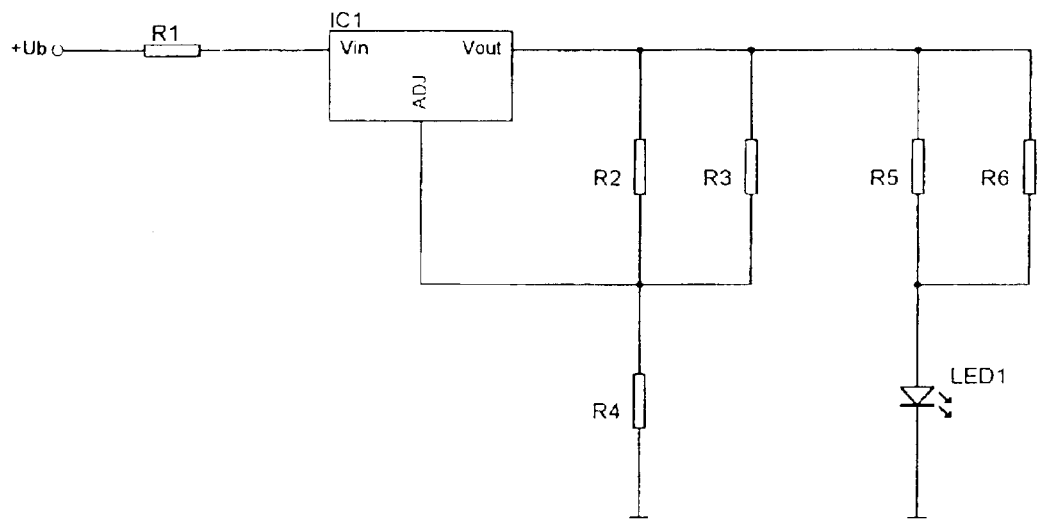
FIGS. 10–15 are circuit diagrams which illustrate specific applications of the method according to the present invention.

The circuit shown in FIG. 10 is a very simple possibility for a practical application of the method. The integrated circuit IC1 is a voltage controller of the LM 317 type of the NATIONAL Company. Such controllers set the voltage at the Vout connection such that the voltage between connectors Vout and ADJ becomes equal to an internally generated reference voltage. Using a voltage splitter consisting of R4 and the parallel circuit R2 and R3, the controller can be set to the required value for $U_B$ with sufficient accuracy. The resistance R is generated using the parallel circuit of R5 and R6.

The resistor R1 is used to keep the voltage drop, and therefore, the waste energy at IC1 as small as possible. The great simplicity of the circuit is purchased with the disadvantage that the power stage of the control circuit and the reference voltage source are located on a common chip. If the reference voltage changes due to temperature influences, $U_B$ will change as well and the light power cannot remain stable. It is therefore advantageous to remove the reference voltage generation locally from heat sources if possible, which is, at least partially, accomplished here with R1.

An additional peculiarity of the circuit according to FIG. 10 is the result of setting the voltage $U_B$ and the resistance R with fixed resistors. This measure is always possible for the subsequent circuits as well; it offers advantages with regard to reliability, size and component price. However, to properly compile the fixed resistors, the diode behavior must be known beforehand, that is, it must have been determined and it may be necessary to equip each circuit separately, which certainly offsets the price advantages.

Figure 11:
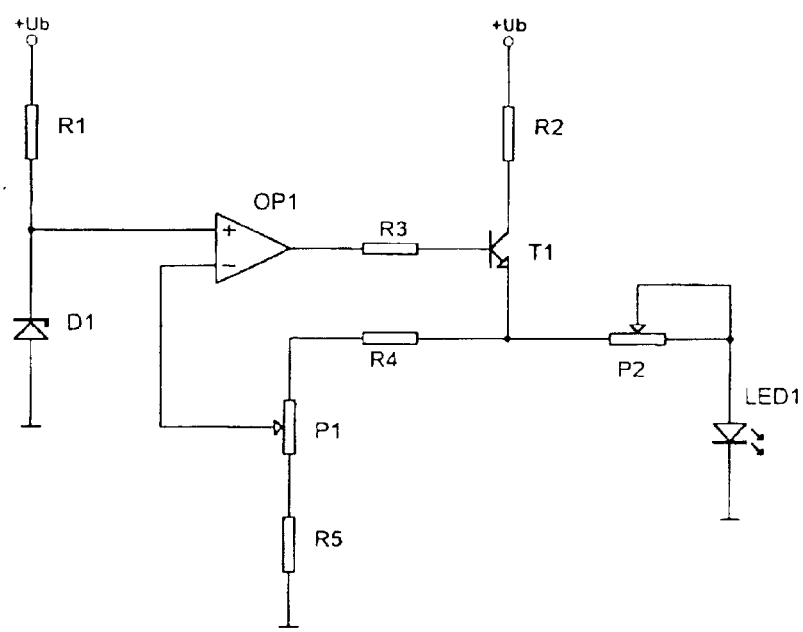

The circuit according to FIG. 11 shall point to alternative design possibilities. Here, the reference voltage is generated in its simplest form with a zener diode D1. However, it is recommended to use a good band-gap reference element. The voltage $U_B$ is generated by OP1 at the emitter of T1 and can be continuously adjusted using the voltage splitter made of R4, P1 and R5. If this voltage splitter is designed rather high-ohmic, then the major sources of heat in this circuit are R2 and T1. They can be installed thermally isolated from D1 and from OP1 as well, whose offset voltage can be temperature-dependent. The resistance R is achieved in an adjustable manner with P2 such that the circuit enables the stabilization of various light powers.

Figure 12:
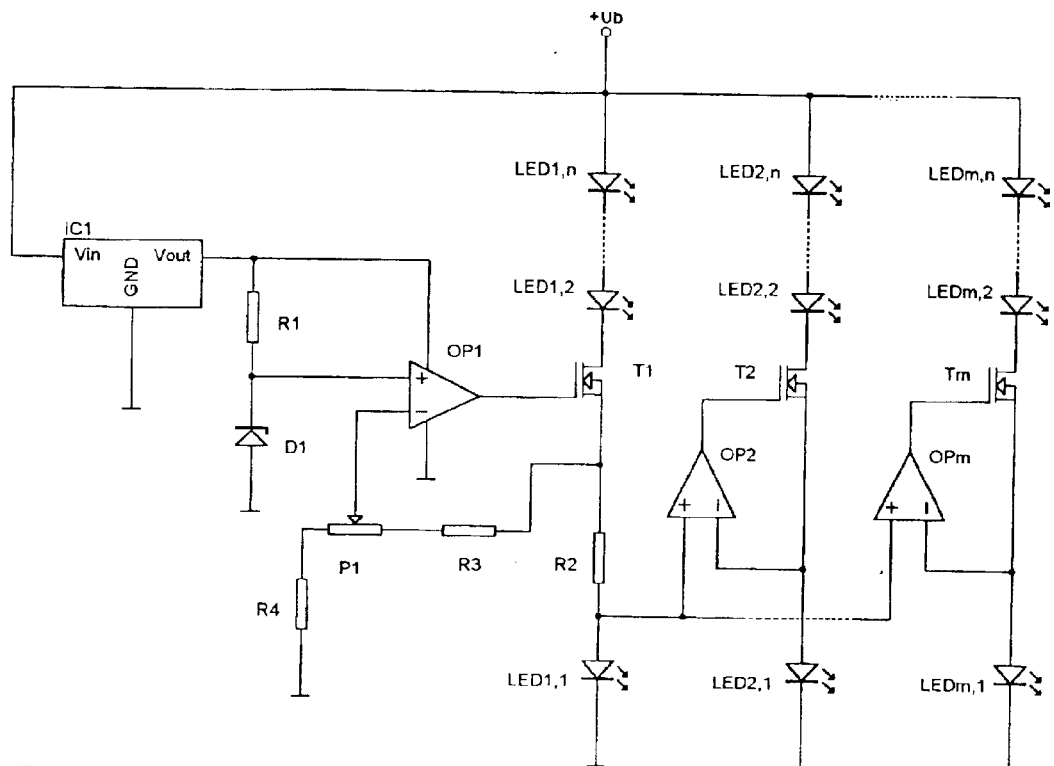

FIG. 12 shows two equally advantageous possibilities of the described method for instances where several, maybe even numerous, light emitting diodes are to be stabilized, as is required for traffic lights, for example. In such a case, one will most likely strive to connect a certain number of diodes in series to keep the energy losses at a common operation voltage of 10–24 V at a minimum. The stabilization of such a series circuit of light emitting diodes can be achieved very easily by stabilizing a single LED (here LED1,1) as shown in FIG. 11 and then connecting the remaining diodes (LED1,2 to LED1,n) in series such that the same current will flow through them. For this purpose, it is advantageous to replace the bipolar transistor T1 in whose emitter circuit the base current flows as well, with an n-channel MOSFET that has a high-ohmic Gate. The voltage splitter consisting of R3, P1 and R4 must, of course, be sufficiently high-ohmic such that the current flowing through it is small in relation to that flowing through the LEDs.

If the forward voltage drop at LED1,1 is obtained, then the current through any number of additional light emitting diodes LED2,1 . . . LEDm,1 can be controlled by using additional operational amplifiers OP2 . . . OPm and additional MOSFETs T2 . . . Tm, such that the same forward voltage is attained at these diodes. If these diodes are of the same type as LED1,1 and if they are at the same temperature, then the same current will flow through them such that the light power will also be stabilized. They can be connected in series in the same manner as LED1,1 with additional light emitting diodes LED2,2 . . . LEDm,n, such that the stabilization of LED1,1 can be expanded to the entire matrix of light emitting diodes. The MOSFETs T1 . . . Tm can be inexpensive low power types that may not even require heat sinks.

In the circuit according to FIG. 12, LED1,1 functions as a temperature sensor for the remaining LEDs. Stabilizing LEDs by using the measurement of a separate temperature sensor in itself is not a new concept, however. LED1,1 is a particularly advantageous temperature sensor. It can be installed exactly in the same manner as the other LEDs and is, thus, subjected to the same thermal influences. Additionally, it has the same thermal properties as the other LEDs, such that the same temperature changes must result from said thermal influences. Furthermore, self-heating due to the waste energy during operation counts as part of these thermal influences which will be taken into account by LED1,1 as well. Finally, the conversion of the measurement signal into adjustment quantities for the remaining LEDs requires no signal processing, since the measurement signal and the adjustment quantity are here in a way one and the same.

An additional advantage of the method results from the fact that the supply voltage +Ub in FIG. 12 does not need to be stabilized. A stable operational voltage is only recommended for generating the reference voltage with D1 and R1 and for the operational amplifiers. Because the current consumption of these circuit components can be made very small (the operational amplifiers need to supply practically no output currents), an inexpensive linear controller IC1 is sufficient, for example of the known 7805 type that does not require any particular cooling measures. Because arrays of numerous light emitting diodes are basically used on account of their low energy consumption, this capability to be able to limit the waste energy to the absolute necessary is to be viewed as an important quality feature of any design of a control circuit.

As can be seen from FIG. 7, one must expect that in certain cases the line of constant light power over the current does not decline but actually shows an incline. If it declines, a value proportional to the current must be subtracted from a constant voltage $U_B$ in order to obtain the required forward voltage of the diode, which can be accomplished easily by adding a resistor to the circuit. However, if it inclines, then this value must be added to $U_B$. One can look at it as a subtraction of a negative value that can be obtained by using a negative resistance.

Negative resistances are no longer passive components and even require a voltage supply, however, they can be built easily by using an operational amplifier. The circuit shown in FIG. 13, uses this approach. The voltage $U_B$ is set at the output of OP1. Contrary to the circuits described thus far, this voltage has practically no load here, such that a driver stage is not necessary at this place. The circuit of OP2, T1, R4, R5 and R6 acts like a negative resistance, where the value is $$R = R_6/(1 + R_5/R_4) \quad (4)$$

and that is connected between the output of OP1 and the anode of LED1. This circuit supplies the current that would flow across a hypothetical negative resistance only at one of its connections; it therefore simulates the behavior of such only when the other connection is at a constant voltage level, e.g. at ground level. However, $U_B$ at the output of OP1 is such a fixed voltage and the current for the LED or laser diode is required at the other connection, where it can be supplied easily by using T1. Furthermore, it should be noted that the circuit used here for the negative resistance is a so-called open circuit stable variant. Simulation calculations have shown that short circuit-stable (open circuit-unstable) circuits do not show a sufficiently defined behavior. The reason for this is most likely that in the current-less condition, the diode has a very high apparent resistance, such that the circuit is, in this case, operated with a practically open connection and can no longer balance itself in a defined manner.

Figure 13:
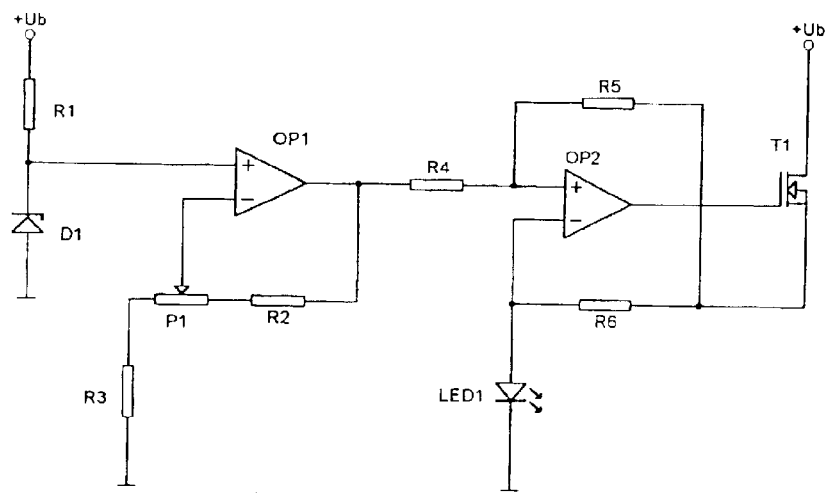
Figure 14:
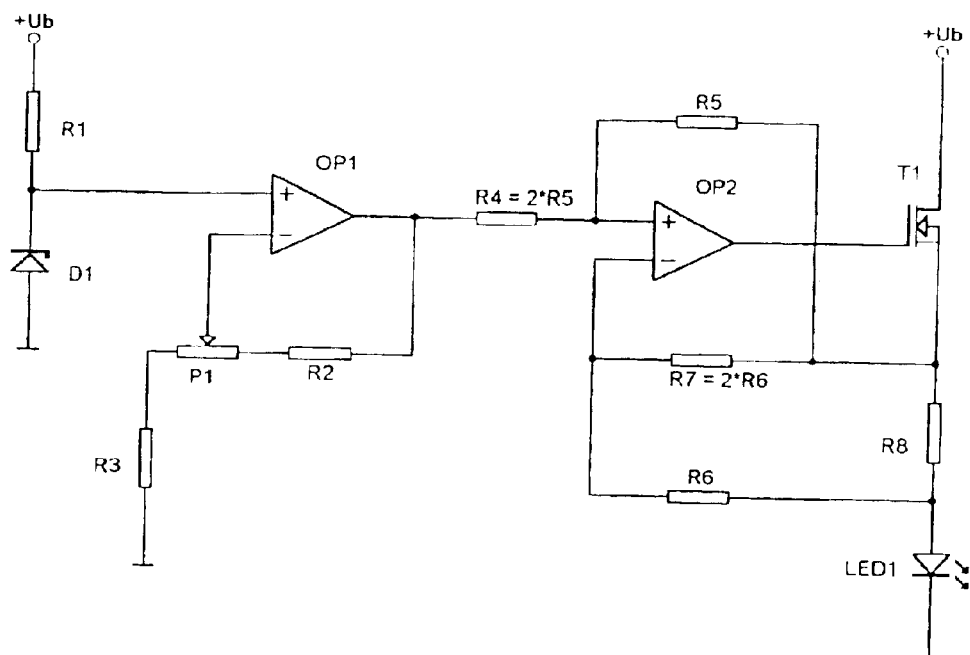

The circuit according to FIG. 14 is also used for stabilizing diodes with an inclining line of constant light power over the current. It looks very similar to the circuit according to FIG. 13, however, it is based on a different idea. The voltage $U_B$ is again set at the output of OP1. It serves as the reference potential for OP2 that is designed as a differential amplifier with an amplification of Two, using the driver stage T1, where the following voltage is set at its output (that is, at the Source of T1)

$$U_{diff} = U_B + 2*R_8*I_{LED} \quad (5)$$

if the resistors R4 and R7 are dimensioned sufficiently great in relation to R8. Since under the same conditions $$U_{LED} = U_{diff} - R_8*I_{LED} \quad (6)$$

is also valid, the result is $$U_{LED} = U_B + R_8*I_{LED} \quad (7)$$

such that the circuit between the output of OP1 and the anode of LED1 behaves like a negative resistance here as well, however with the value $R = -R_8$.

If the method is, as described thus far, designed exclusively using analog technology, then its application is limited in as far as the stabilized light power cannot be varied easily. The reason is that both $U_B$ and R must be altered together, where a functional correlation must be maintained between the two quantities. This requires great effort using analog technology, however, it can be easily accomplished using the software of a micro-controller ($\mu c$). All that is required is an arrangement according to FIG. 15 that under certain conditions can be simplified even further.

The forward voltage of the light emitting or laser diode LED1 is measured by using an analog/digital converter ADC1, where the operational amplifier OP1 can be switched either as an impedance converter as shown or as a non-inverting amplifier because the measurement ranges of common A/D converters are significantly greater than the voltages that occur here. Depending on the design of the A/D converter used, it may even be entirely omitted.

The current flowing through LED1 is obtained by the voltage on LED1 and, in addition, to the voltage at the positive connection of a resistor R1 connected in series, which in this case, has nothing to do with the resistance R of equation 2 or FIG. 3, respectively. This can be accomplished by measuring it in the same manner using ADC2 and OP2, or by a well-defined control using a digital/analog converter DAC1 and an amplifier circuit consisting of OP3 and T1. If it is measured, the D/A interface for controlling the current can be designed in a simple manner, however, if it is more prudent to make the latter more precise, then the measurement is not necessary.

Then the algorithm for stabilizing the LED or laser diode that is to be repeated cyclically is the result of the demand that equation 2 must be fulfilled. First, $U_{LED}$ and $I_{LED}$ are determined as described above. If the value of the expression $R*I_{LED} + U_{LED}$ is smaller than $U_B$, then the current, or the value at the output of the D/A interface, is increased, otherwise, it is decreased. At program start, this value is initialized with 0. Additionally, a query can be made whether equation 2 is fulfilled, in which case no action is required, however, that is not necessary.

The individual behavior of the LED or laser diode at a particular light power is described here by only two constants $U_B$ and R. It is not difficult to conceive these constants as a function of any variable relating to the light power and to obtain it from a previously created table or to interpolate interim values. Thus, with the use of a micro-controller ($\mu c$), the stabilized light power can very easily be designed in a variable manner. It requires very little computing power and memory and the programming effort is very low as well.

The algorithm works for both positive and negative values of R. It works even if the relation between current and voltage for the line of constant light power is not linear. In this case, this relation can, of course, no longer be described by two constants $U_B$ and R and calculated using equation 2. However, the algorithm cannot work in an area where the diode characteristics intersect (see FIG. 8), because it cannot be determined with sufficient certainty, whether the combination of current and forward voltage is "below" or "above" the line of constant light power.

Figure 15:
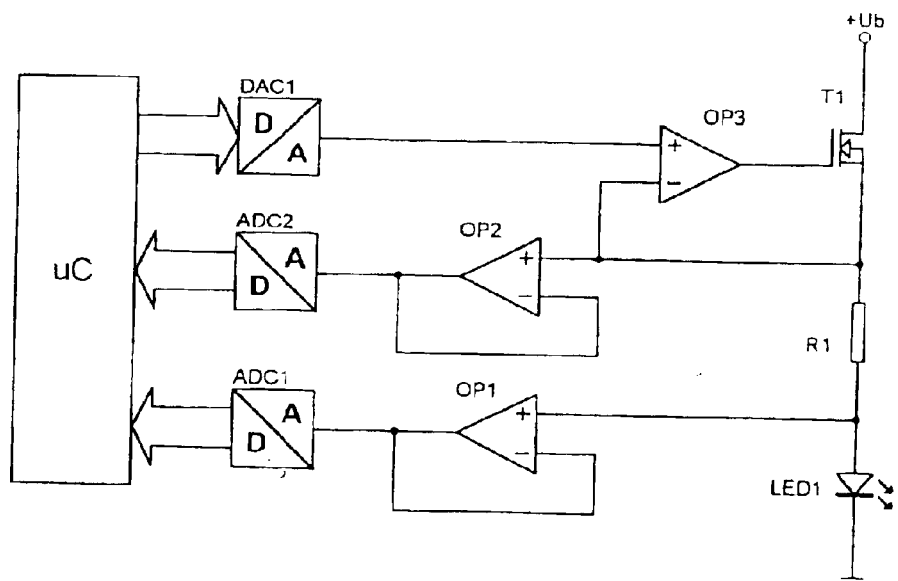

Similar to FIG. 12, all circuits of FIG. 13 through FIG. 15 can be extended to stabilize an entire matrix of LEDs. The only prerequisite is that a MOSFET is used as the driver stage and that the cathode of the LED is connected to ground potential, which is the case in the circuits mentioned.

A modulation, that is, a turning on and off the light emitted by the light emitting diode or the laser diode for the purpose of eliminating the influence of the surrounding light or to reduce the power consumption can be accomplished simply by bring the voltage $U_B$ to zero in a suitable manner. If it is generated as shown in the circuits according to FIG. 11 to FIG. 14, shorting the reference diode D1 offers itself as a possible method for doing this. The possible modulation frequencies are then determined by the transient times of the operational amplifiers used. Since these should all be clearly below 100 $\mu$sec, modulation frequencies of up to a few kilohertz should cause no difficulties.

A circuit according to FIG. 10 is not very suitable for modulation because a voltage controller of the type that is used there, can not easily be made to provide a voltage near zero. One would have to interrupt the supply; however, since buffering capacitors are often required when using integrated voltage controllers, particularly high clock frequencies cannot be achieved. A current interruption at the output side is not recommended because the switch required for this purpose always has a certain resistance and is in series with R, thus falsifying the value of R.

Using a micro-controller according to FIG. 15 results in slight restrictions of the modulation capability. While the electric behavior of the LED or laser diode in the circuits mentioned above influences the optical behavior directly, here, the actual electrical properties must first be determined, before they can have an effect on the optical behavior. However, this cannot occur when the diode is switched off. Its effect depends on how the modulation frequency, measurement rate and the speed of internal and external temperature influences relate to one another. If the modulation frequency is so high that the chip temperature is between two on-phases cannot change significantly or if the diode is switched off only for a short time to measure the surrounding brightness, the $\mu$C can continue with the old measurement values when switching on. Especially in the case of high modulation frequency, a high measurement rate or processing speed is then required. On the other hand, if the off-phases become so long that the chip can cool down significantly during this time or that even changes in the surrounding temperature can occur, the line of constant light power must again be approached. For this to occur quickly, quick cycle times are desirable here as well. It can be said that for a modulation of the light the requirements on the performance of the micro-controller generally increase, and it may be that between the two extreme cases of high and low modulation frequencies such cases exist where a stabilization of the LED or of the laser diode is not possible at all.

The circuit examples mentioned here are to be understood as circuit principles. Components that are not necessary for their understanding have been omitted. This includes especially the often required protective circuits for the LED or laser diode. Especially laser diodes but also light-intensive, and therefore expensive, LEDs are very sensitive to over-voltage in both the forward and high resistance direction. An anti-parallel connected Z-diode with a breakthrough voltage slightly above the maximum occurring flow voltage $U_{LED}$ can already prevent damage to these components. It should also be noted that depending on the components used, the circuits mentioned above can generate short-term over-voltages either when switching on the supply or when modulating and that the diode must be protected from such over-voltages, for example, by employing suitable buffer capacitors.

Determining the values of the constants $U_B$ and R using the measurement arrangement according to FIG. 1 mentioned at the outset can be somewhat cumbersome. However, such a measurement structure is hardly dispensable when determining the basic behavior of an unknown type of light emitting or laser diode. However, if the behavior is known and if light emitting diodes or laser diodes are to be stabilized in larger quantities it would be—even administratively—very elaborate to measure all components prior to installation and to balance the circuit based on these measurement results. Such a balance would also not be very precise, because, as can be seen for example from FIG. 4, the point cloud obtained from the measurements must essentially be extrapolated to obtain the value for $U_B$. According to equation 2, $U_B$ corresponds to the value of $U_{LED}$ for $I_{LED}=0$ and cannot be measured directly. Because of this, and also because subsequent balancing needs to be carried out without the need to observe the stabilization of the light power, it becomes difficult to set the values that constitute the maximum temperature stability.

It is much more beneficial to first install the light emitting diode or laser diode in the circuit and to balance the behavior of the latter then during operation such that the light power remains stable. To this end, it is necessary to somehow display the temperature effect on the light power. This is accomplished by utilizing the self-heating of the LED or laser diode after power up. It is beneficial if this is a rather quick process because due to the small dimensions of the chips, they exhibit small thermal capacities and the temperature rises quickly after switching on the current.

To this end, one installs the circuit in an appropriate device that allows for the measurement of the emitted light power without interfering influence from the surrounding light and switches the current on and off using a suitable clocking device. This can be done by turning the supply voltage on and off but also by using a modulation capability that may be present. The measurement signal for the light power can then be presented on an oscillograph, for example.

Figure 16:
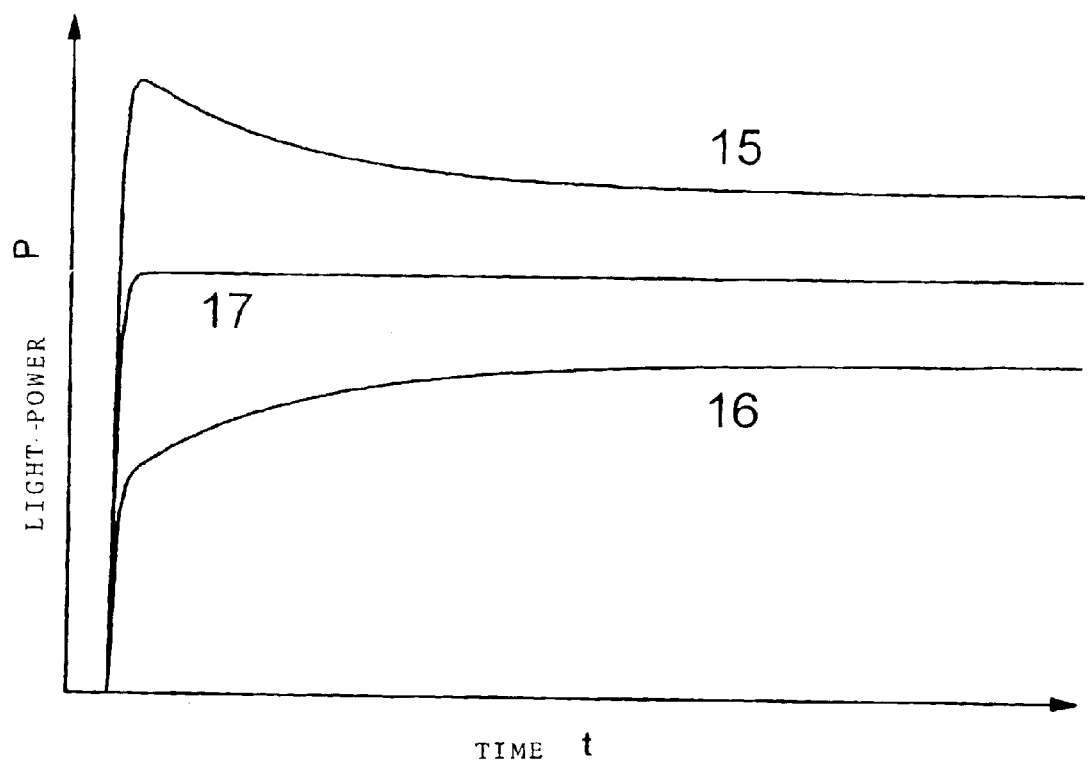
FIG. 16 is a diagram of light output power vs. time for a diode with different series resistance.

Examples for resulting time progressions are shown qualitatively in FIG. 16. An unstable diode or one with an undercompensated temperature pattern shows after power up a behavior similar to curve 15. Initially, the light power increases quickly and then drops again because of the temperature increase. In such a case, either the resistance R or the voltage $U_B$ needs to be lowered depending on whether the asymptote of the curve is below or above the desired light power. Overcompensation that can be compensated by increasing either R or $U_B$ is present if the light power shows a progression similar to curve 16. Curve 17 shows the progression of the light power for a correctly selected combination of R and $U_B$.

FIG. 16 illustrates balancing by variation of $U_B$ alone. If only R is varied, the result is an undercompensated, declining curve under the one for the compensated condition, while the overcompensated one lies above it. If maintaining a very particular light power were not required, it would be most beneficial to specify a fixed resistance R and to carry out the balancing only by varying $U_B$. If then the circuit is designed such that $U_B$ is generated by using, for example, a D/A converter and writing the value found to be correct during balancing into a non-volatile memory, then the balancing can be performed fully automatic with data technology means at the fully assembled unit.

The balancing method described here also offers an option for self-balancing of the light source of measurement instruments because these often contain a photo detector that receives the light emitted by the light source. If both signal processing and stabilization of the light source are accomplished by the same micro-controller (see FIG. 15), then this controller can be programmed such that at a defined condition of the measurement path, it can by itself determine the required data for stabilizing the light source at a well defined light power.

As mentioned in the description of FIG. 15, under normal circumstances these data consist of two constants for $U_B$ and R. Because the micro-controller can both turn the light on and off at will and has access to the time progression of the light power, it is in a condition to perform the balancing described above autonomously by iterative variation of this constant. It can begin with specified approximations, e.g., the values determined at the last balancing. However, it can also find approximations by itself initially forcing a constant light power at power up and during this process recording the required current $I_{LED}$ and the resultant voltage $U_{LED}$ that must also be measured. This is nothing else than is done with a measurement device according FIG. 1. $U_B$ and R can be determined in the same manner from the measured data. One cannot expect that they have the same accuracy but they are certainly usable as an initial approximation for a subsequent iterative fine balancing.

In this manner non-linear progressions of the line of constant light power can be handled as well. Of course, the complexity of the procedure may increase, but this path is available in cases where a certain light emitting diode or laser diode must be used in spite of its unfavorable behavior with regard to its stabilization.

With the present invention, light emitting diodes or laser diodes can be stabilized with a discrete circuit according to FIGS. 10 to 15. An additional module containing a circuit according to FIGS. 10 to 15 can also accomplish this. The circuits can also include a micro-controller interface and be realized using appropriate software. This is also possible by an integrated circuit that is adapted to the requirements and desires of the customer. The stabilization circuit can also be integrated in the light emitting diode.

There has thus been shown and described a novel method for stabilizing the optical output power of light emitting diodes and laser diodes which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a method for stabilizing the optical output power (light power) of a diode selected from the group consisting of a light emitting diode and a laser diode, the improvement comprising the step of maintaining the light power emitted by the diode substantially constant from solely a combination of the forward current and forward voltage of the diode, based on the assumption that at a constant light power the forward voltage is a particular function of the forward current.

2. The method as set forth in claim 1, wherein the particular function that yields the forward voltage from the forward current of the diode at a constant light power is determined once, through measurements at various temperatures, prior to maintaining the light power emitted by the diode substantially constant.

3. The method as set forth in claim 2, wherein the forward voltage is measured via an analog/digital interface using a suitable data processing device, and wherein the forward current is controlled via a digital/analog interface such that the previously determined particular function is established between the set forward current and the measured forward voltage.

4. The method as set forth in claim 2, wherein it is presumed that the particular function, from which at a constant light power the forward voltage is determined from the forward current, is linear.

5. The method as set forth in claim 4, wherein, in case the particular function yields a constant forward voltage for increasing forward current and constant light power, this behavior is established by directly connecting the diode to a constant voltage source.

6. The method as set forth in claim 4, wherein, in case the particular function yields a linearly decreasing forward voltage for increasing forward current and constant light power, this behavior is established through the operation of the diode together with a resistor connected in series with a constant voltage source.

7. The method as set forth in claim 4, wherein, in case the particular function yields a linearly increasing forward voltage for increasing forward current and constant light power, this behavior is established by directly connecting the diode to a circuit which exhibits the behavior of a constant voltage source connected in series with a resistor of negative resistance.

8. A method for stabilizing a plurality of similar light emitting diodes or laser diodes, wherein a first diode is stabilized using the method set forth in claim 3, and wherein the remaining diodes are connected in series and operated such that the current flowing through the first diode also flows through the remaining ones.

9. A method for stabilizing a plurality of similar light emitting diodes or laser diodes, wherein a first diode is stabilized using the method set forth in claim 3, and wherein the remaining diodes are operated by one or more voltage sources whose source voltage follows the forward voltage of the first diode.

10. A method for stabilizing a plurality of similar light emitting diodes or laser diodes, wherein a first diode is stabilized using the method set forth in claim 3, a first portion of the remaining diodes is connected in series and operated such that current flowing through said first diode also flows through the first portion of the remaining diodes, a second portion of one or more of the remaining diodes is operated by connecting each to a voltage source whose voltage follows the forward voltage of the first diode and wherein one or more additional portions of the remaining diodes are connected in series and operated such that the currents flowing through the diodes of the second portion flow also through the diodes of the additional portions.

11. A method for determining a particular function that yields a forward voltage of a diode, selected from the group consisting of a light emitting diode and a laser diode, from the forward diode current at a constant output light power, comprising the steps of: varying the temperature of the diode using a heating or cooling device; determining the emitted light power by means of a photodetector; and maintaining the emitted light power at a constant level by means of a control device and measuring the values of the forward voltage and the forward current of the diode at various temperatures.

12. A method for determining the parameters of a particular linear function that yields the forward voltage from the forward current of a diode selected from the group consisting of a light emitting diode and a laser diode at a constant light power, the method comprising tracing the time progression of the light power during a power-up procedure and setting the parameters such that the light power remains constant in spite of the increasing temperature of the diode after power up.

13. The method as set forth in claim 1, further comprising an initial step of determining the particular function prior to maintaining the light power emitted by the diode substantially constant.

14. The method set forth in claim 1, wherein the diode is connected to an electric circuit that causes the functional relationship between forward current and forward voltage to be the particular function.

* * * * *